(12) United States Patent
Ishiduka et al.

(10) Patent No.: US 8,409,781 B2
(45) Date of Patent: Apr. 2, 2013

(54) COMPOSITION FOR FORMATION OF RESIST PROTECTION FILM, AND METHOD FOR FORMATION OF RESIST PATTERN USING THE SAME

(75) Inventors: Keita Ishiduka, Kanagawa (JP); Toshikazu Takayama, Kanagawa (JP)

(73) Assignee: Tokyo Ohka Kogyo Co., Ltd., Kanagawa (JP)

(*) Notice: Subject to any disclaimer, the term of this patent is extended or adjusted under 35 U.S.C. 154(b) by 658 days.

(21) Appl. No.: 12/440,784

(22) PCT Filed: Sep. 14, 2007

(86) PCT No.: PCT/JP2007/067987
§ 371 (c)(1),
(2), (4) Date: Mar. 11, 2009

(87) PCT Pub. No.: WO2008/035641
PCT Pub. Date: Mar. 27, 2008

(65) Prior Publication Data
US 2010/0040973 A1      Feb. 18, 2010

(30) Foreign Application Priority Data

Sep. 20, 2006   (JP) .................................. 2006-254469

(51) Int. Cl.
*G03C 1/00*     (2006.01)
*G03F 7/00*     (2006.01)

(52) U.S. Cl. .................... 430/270.1; 430/271.1; 430/325

(58) Field of Classification Search ............... 430/270.1, 430/271.1, 273.1
See application file for complete search history.

(56) References Cited

U.S. PATENT DOCUMENTS

| | | | |
|---|---|---|---|
| 2005/0250898 A1 | 11/2005 | Maeda et al. | |
| 2005/0266354 A1* | 12/2005 | Li et al. | 430/322 |
| 2006/0036005 A1* | 2/2006 | Kanda et al. | 524/55 |
| 2012/0028198 A1* | 2/2012 | Nakamura et al. | 430/325 |

FOREIGN PATENT DOCUMENTS

| | | | |
|---|---|---|---|
| EP | 1315043 A1 * | 5/2003 | |
| JP | 2005-264131 | | 9/2005 |
| JP | 2005-352384 A | | 12/2005 |
| JP | 2006-023538 A | | 1/2006 |
| JP | 2006-030477 A | | 2/2006 |
| JP | 2006-243309 A | | 9/2006 |
| JP | 2007219180 A * | 8/2007 | |
| JP | 2007 233322 A | | 9/2007 |
| JP | 2007 233322 A | | 3/2009 |
| WO | 2004/068242 A1 | | 8/2004 |
| WO | 2004/074937 A1 | | 9/2004 |
| WO | 2005/098541 A1 | | 10/2005 |
| WO | 2006/035790 A1 | | 4/2006 |
| WO | WO 2006091523 A2 * | 8/2006 | |

OTHER PUBLICATIONS

Ishiduka et al., JP2007-219180A, English Translation.*
Notice of Reasons for Rejection issued to JP Application No. 2006-254469, mailed Mar. 23, 2010.
Hoffnagle, et al.; Liquid immersion deep-ultraviolet interferometric lithography; Journal of Vacuum Science & Technology B; vol. 17, No. 6; American Vacuum Society; Nov./Dec. 1999; pp. 3306-3309.
Switkes et al.; Immersion lithograph at 157 nm; Journal of Vacuum Science & Technology B; vol. 19, No. 6; American Vacuum Society; Nov./Dec. 2001; pp. 2353-2356.
Switkes et al.; Resolution Enhancement of 157 nm Lithography by Liquid Immersion; Proceedings of SPIE; vol. 4691; 2002; pp. 459-465.
Official Letter issued to corresponding Taiwanese Application No. 96134998, dated Jul. 8, 2011.

* cited by examiner

*Primary Examiner* — Cynthia Kelly
*Assistant Examiner* — Connie P Johnson
(74) *Attorney, Agent, or Firm* — Hoffmann & Baron, LLP

(57) ABSTRACT

Disclosed are: a composition for forming a resist protection film, which shows less damage to a resist film, can form a good, rectangular resist pattern, and can be used regardless of the structure of a resin used in a resist composition; and a method for forming a resist pattern by using the composition. Specifically, disclosed are: a composition for forming a resist protection film, which comprises (a) an alkali-soluble polymer and (b) an ether-based solvent; and a method for forming a resist pattern by using the composition.

3 Claims, No Drawings

COMPOSITION FOR FORMATION OF RESIST PROTECTION FILM, AND METHOD FOR FORMATION OF RESIST PATTERN USING THE SAME

CROSS-REFERENCE TO RELATED APPLICATIONS

This application is the National Stage of International Application No. PCT/JP2007/067987, filed Sep. 14, 2007, which claims the benefit of Japanese Application No. 2006-254469, filed Sep. 20, 2006, the contents of which are incorporated by reference herein.

TECHNICAL FIELD

The present invention relates to a composition for forming a resist protection film on a resist film, and more particularly relates to a composition for forming a resist protection film which contains (a) an alkali-soluble polymer and (b) an ether-based solvent, and a method for forming a resist pattern using this composition for forming the resist protection film.

BACKGROUND ART

In recent years, a liquid immersion lithography process has been reported as a new lithography technique (see Non-patent Document 1 to 3). In this method, a resist film is exposed to form a resist pattern in a state where a liquid immersion medium having a predetermined thickness is interposed on at least the resist film in an exposure light path between an exposure device (lens) and the resist film on a substrate upon exposure.

Air or an inert gas such as nitrogen has been interposed in a conventional exposure light path space, but in this liquid immersion lithography process, the gas in the exposure light path space is replaced with the liquid immersion medium (e.g., pure water and fluorine-based inert liquids) having a refractive index (n) which is larger than that of the gas and is smaller than that of the resist film. Thereby, the liquid immersion lithography process has an advantage that even though a light source having a wavelength for the exposure conventionally used is employed, high resolution can be achieved without lowering the focal depth width like the case where a light source having a shorter wavelength or a lens having a higher NA is used.

By using a resist composition for such a liquid immersion lithography process and the lens mounted in the existing exposure device, it is possible to form the resist patter having a higher resolution and an excellent focal depth with low cost (see Patent Document 1).

Also a technology which aims at simultaneously preventing an alteration of the resist film due to the liquid immersion medium and a variation of the refractive index associated with the alteration of the liquid immersion medium due to an elution component from the resist film by forming a resist protection film on the resist film using a fluorine-containing resin which can be dissolved only in a particular solvent and interposing the liquid immersion medium on this resist protection film has been proposed (see Patent Document 2)

More recently, from viewpoints of simplifying a resist pattern formation process and enhancing a production efficiency, a technology in which by using the resist protection film which is alkali-soluble, removal of the resist protection film and the formation of the resist pattern are performed simultaneously upon alkali development after the liquid immersion exposure has been proposed (see Patent Document 3).

Non-Patent Document 1: Journal of Vacuum Science & Technology B (Published in U.S.A.), Vol. 17, No. 6, pp. 3306-3309, 1999.

Non-Patent Document 2: Journal of Vacuum Science & Technology B (Published in U.S.A.), Vol. 19, No. 6, pp. 2353-2356, 2001.

Non-Patent Document 3: Proceedings of SPIE (Published in U.S.A.), Vol. 4691, pp. 459-465, 2002.

Patent Document 1: PCT International Publication No. WO 2004/068242

Patent Document 2: PCT International Publication No. WO 2004/074937

Patent Document 3: Japanese Unexamined Patent Application, Publication No. 2005-264131

DISCLOSURE OF THE INVENTION

Problems to be Solved by the Invention

Here, the solvent mainly used in materials for forming the resist protection film disclosed in Patent Document 3 is alcohol. However, when alcohol is used as the solvent, the resist film is greatly damaged, the resulting resist pattern shows a T-top shape, and surface roughness and swelling of the resist pattern occur in some cases. The use of alcohol is sometimes limited depending on a structure of a polymer (resin) used for the resist composition.

In view of the above problems, it is an object of the present invention to provide a composition for forming a resist protection film which shows less damage to a resist film, can form a good rectangular resist pattern and can be used regardless of the structure of a polymer in a resist composition, and a method for forming a resist pattern using this composition for forming the resist protection film.

Means for Solving the Problems

The present inventors have found that the above problems can be solved by using ether as a solvent for the composition for forming the resist protection film, and completed the present invention. The present invention is specifically as follows.

The present invention provides a composition for forming a resist protection film on a resist film and contains (a) an alkali-soluble polymer and (b) an ether-based solvent.

The present invention also provides a method for forming a resist pattern including the steps of: forming the resist film on a substrate, forming a resist protection film on the resist film using the composition for forming the resist protection film, exposing the resist film through the resist protection film, and removing the resist protection film with a developer and developing the resist film after the exposure step.

Effects of the Invention

According to the present invention, by using the ether-based solvent it becomes possible to reduce the damage to the resist film. It also becomes possible to provide the composition for forming the resist protection film which can be used regardless of the structure of the polymer in the resist composition.

This enables the formation of a good rectangular resist pattern.

PREFERRED MODE FOR CARRYING OUT THE INVENTION

Hereinafter, embodiments of the present invention will be explained in detail.

Composition for Formation of Resist Protection Film

The composition for forming the resist protection film according to the present invention can be used in any of the liquid immersion lithography process and a dry exposure process.

The composition for forming the resist protection film of the present invention contains (a) the alkali-soluble polymer (hereinafter also referred to as a component (a)) and (b) the ether-based solvent (hereinafter also referred to as a component (b)). Each component will be described below.

(a) Alkali-Soluble Polymer

The alkali-soluble polymer of the component (a) specifically includes the following aspects. First, as a first aspect of the alkali-soluble polymer (a), a polymer having a monomer unit represented by at least the following general formula (A-1) as a constitutional unit can be used.

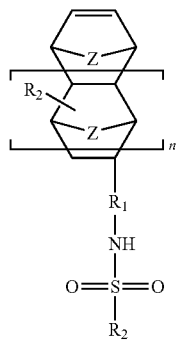

(A-1)

In the above general formula (A-1), $R_1$ is an alkylene group or a fluoroalkylene group having 1 to 6 carbon atoms, $R_2$ are each independently hydrogen atoms or straight chain, branched chain or cyclic alkyl groups or fluoroalkyl groups having 1 to 6 carbon atoms, Z is an alkylene group having 1 to 2 carbon atoms or an oxygen atom, and n is an integer of 0 to 3.

In particular, $R_1$ specifically includes straight chain alkylene groups such as methylene, ethylene, n-propylene, n-butylene and n-pentylene, and branched chain alkylene groups such as 1-methylethylene, 1-methylpropylene and 2-methylpropylene. A portion of or all of hydrogen atoms in these alkylene groups may be substituted with fluorine atoms. Among them, $R_1$ is preferably the methylene group.

$R_2$ specifically includes straight chain alkyl groups such as methyl, ethyl, n-propyl, n-butyl and n-pentyl and branched chain alkyl groups such as isopropyl, 1-methylpropyl and 2-methylpropyl in addition to the hydrogen atom. A portion of or all of hydrogen atoms in these alkyl groups may be substituted with fluorine atoms. Among them, in terms of enhancing a water repellent property, $R_2$ is preferably a perfluoroalkyl group where all of the hydrogen atoms in the alkyl group have been substituted with fluorine atoms, and particularly preferably a trifluoromethyl group. Furthermore, in the above general formula (A-1), Z is preferably a methylene group, and n is preferably 0.

The alkali-soluble polymer in the first aspect may also be a copolymer having the constitutional unit represented by the above general formula (A-1), and at least one selected from monomer units represented by the following general formulae (A-2), (A-3) and (A-4) as the constitutional unit.

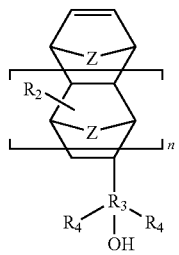

(A-2)

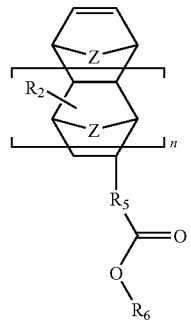

(A-3)

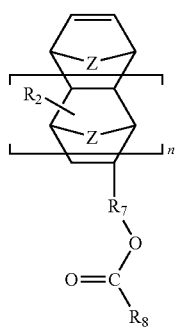

(A-4)

In the above general formulae (A-2), (A-3) and (A-4), $R_3$ is an alkylene group or a fluoroalkylene group having 1 to 6 carbon atoms, $R_5$ and $R_7$ are each alkylene groups or fluoroalkylene groups having 0 to 6 carbon atoms, $R_4$, $R_6$ and $R_8$ are each straight chain, branched chain or cyclic alkyl or fluoroalkyl groups having 1 to 15 carbon atoms (where a part of the alkyl group may be bound through an ether bond, and further a portion of the hydrogen atoms or the fluorine atoms in the alkyl group or the fluoroalkyl group may be substituted with hydroxyl groups), and $R_2$, Z and n are the same as defined in the above general formula (A-1).

The monomer units represented by the above general formulae (A-2), (A-3) and (A-4) are preferably the monomer units represented by the following general formulae (A-5), (A-6) and (A-7), respectively.

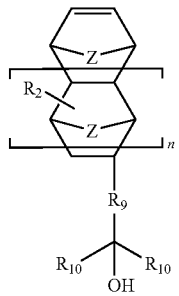

(A-5)

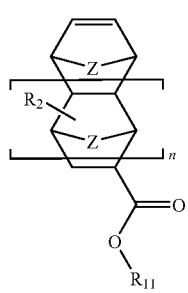

(A-6)

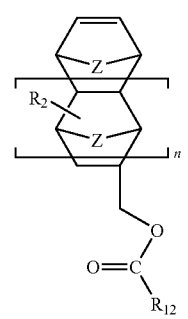

(A-7)

In the above general formulae (A-5), (A-6) and (A-7), $R_9$ is a single bond or a methylene group, $R_{10}$ are each independently the methyl groups or the trifluoromethyl groups, $R_{11}$ is a straight chain or branched chain alkyl or fluoroalkyl groups having 2 to 10 carbon atoms (where a portion of the hydrogen atoms or the fluorine atoms in the alkyl group or the fluoroalkyl group may be substituted with hydroxyl groups), $R_{12}$ is a straight or branched alkyl or fluoroalkyl group having 5 to 10 carbon atoms (where a portion of the hydrogen atoms or the fluorine atoms in the alkyl group or the fluoroalkyl group may be substituted with hydroxyl groups), and $R_2$, Z and n are the same as defined in the above general formula (A-1).

Among them, $R_{11}$ is preferably —$CH_2C_2F_5$ or —$C(CH_3)_2CH_2C(CF_3)_2OH$, and $R_{12}$ is preferably —$C_7F_{15}$, —$CF_2CF(CF_3)CF_2CF_2CF_2CF(CF_3)_2$, or —$CF_2CF(CF_3)CF_2C(CF_3)_3$.

By incorporating the monomer unit having a sulfone amide group represented by the above general formula (A-1) in a side chain into the alkali-soluble polymer, it becomes possible to form the protection film comprising required basic properties particularly when applied to the liquid immersion lithography process.

Here, the basic properties required for the protection film include being high in resistance to the liquid immersion medium, being low in compatibility to the resist film provided in an underlayer, being capable of preventing permeation of the component of the liquid immersion medium to the resist film, further, being capable of preventing elution of the component from the resist film to the liquid immersion medium, and being capable of restraining gas permeation of the protection film. Furthermore, by incorporating at least one constitutional unit selected from the monomer units represented by the above general formulae (A-2), (A-3) and (A-4), it becomes possible to form a protection film having a further enhanced water repellent property.

When the alkali-soluble polymer is used as the copolymer, a constitutional ratio (molar ratio) of the monomer unit represented by the general formula (A-1) to at least one selected from the monomer units represented by the general formulae (A-2), (A-3) and (A-4) is preferably 60:40 to 99:1.

Subsequently, as a second aspect of the alkali-soluble polymer (a), it is possible to use a polymer having the alkali-soluble constitutional unit composed of an aliphatic cyclic compound having a fluorine atom(s) or a fluoroalkyl group(s) and an alcoholic hydroxyl group(s) or an alkyloxy group(s) together.

That is, the fluorine atom or the fluoroalkyl group and the alcoholic hydroxyl group or an alkyloxy group, which are the above constitutional units are each bound to the aliphatic cyclic compound, respectively, and an aliphatic ring composes a main chain.

The fluorine atom and the fluoroalkyl group specifically include trifluoromethyl, pentafluoroethyl, heptafluoropropyl and nonafluorobutyl groups, and the fluorine atom and the trifluoromethyl group are industrially preferable. The alcoholic hydroxyl group or the alkyloxy group specifically includes alcoholic hydroxyl groups, or straight chain, branched chain or cyclic alkyloxyalkyl groups or alkyloxy groups having 1 to 15 carbon atoms.

The alkyloxy group having 1 to 15 carbon atoms specifically includes methyloxy, ethyloxy, propyloxy and butyloxy groups. The alkyloxyalkyl group having 1 to 15 carbon atoms includes methyloxymethyl, ethyloxymethyl, propyloxymethyl and butyloxymethyl groups.

The polymer having such a constitutional unit is formed by cyclization polymerization of a diene compound having the hydroxyl group and the fluorine atom(s). The diene compound is preferably heptadiene which is excellent in transparency and dry etching resistance and easily forms the polymer having a 5-membered or 6-membered ring. It is industrially the most preferable to be the polymer formed by the cyclization polymerization of 1,1,2,3,3-pentafluoro-4-trifluoromethyl-4-hydroxy-1,6-heptadiene ($CF_2$=$CFCF_2C(CF_3)(OH)CH_2CH$=$CH_2$).

The structure of the above polymer is specifically shown below.

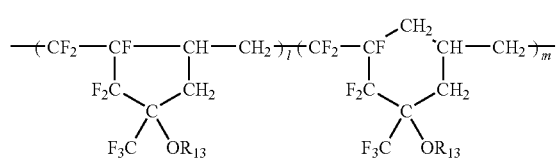

(A-8)

In the general formula (A-8), $R_{13}$ are each independently hydrogen atoms or straight chain, branched chain or cyclic alkyloxy groups or alkyloxyalkyl groups having 1 to 15 carbon atoms. In the formula, l and m represent a molar ratio of the structure in parenthesis, and are each 10 mol % to 90 mol %.

Subsequently, as a third aspect of the alkali-soluble polymer (a), a polymer having the constitutional units represented by the general formulae (A-9) and (A-10) can be used.

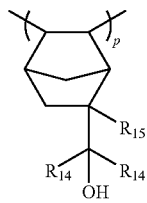

(A-9)

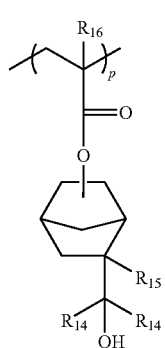

(A-10)

In the general formulae (A-9) and (A-10), $R_{14}$ are each independently straight chain, branched chain or cyclic alkyl groups or fluoroalkyl groups having 1 to 5 carbon atoms, $R_{15}$ are each independently hydrogen atoms, fluorine atoms or straight chain, branched chain or cyclic alkyl groups or fluoroalkyl groups having 1 to 5 carbon atoms, and at least any of these $R_{14}$ and $R_{15}$ is the group having fluorine atom(s). $R_{16}$ is a hydrogen atom or a methyl group, and p is a repeating unit number.

As the constitutional units represented by the general formulae (A-9) and (A-10), more specifically, the constitutional units represented by the following structural formulae (A-11) and (A-12) are preferably used, respectively.

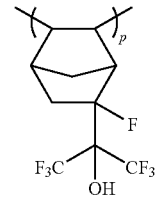

(A-11)

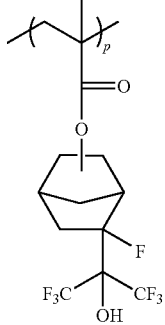

(A-12)

The polymers having the constitutional units represented by the (A-9) and (A-10) may be a copolymer and/or a mixed polymer with the constitutional unit represented by the following general formula (A-13). By making such a copolymer and/or mixed polymer, the alkali-solubility can be further enhanced.

$$-\!\!\left(\!C(R_{17})_2\!-\!C(R_{17})_2\!\right)_{\!p}\!\!-$$

(A-13)

In the above general formula (A-13), $R_{17}$ are each independently hydrogen atoms or straight chain branched chain or cyclic alkyl groups or fluoroalkyl groups having 1 to 5 carbon atoms, and p is the repeating unit number similarly to the general formulae (A-9) and (A-10).

Subsequently, as a fourth aspect of the alkali-soluble polymer (a), a polymer having the constitutional unit represented by the general formula (A-14) can be used.

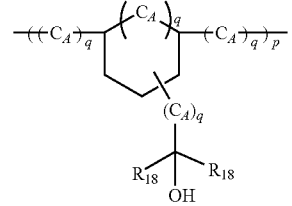

(A-14)

In the above general formula (A-14), CA is a methylene group or a fluoromethylene group, $R_{18}$ are straight chain, branched chain or cyclic fluoroalkyl groups having 1 to 5 carbon atoms, q is an integer of 0 to 3 and p is the repeating unit number similarly to the general formulae (A-9) and (A-10).

In the above general formula (A-14), a portion of or all of the hydrogen atoms bound to the carbon atoms which compose a ring skeleton may be substituted with fluorine atoms.

As the constitutional unit represented by the above general formula (A-14), specifically the constitutional unit represented by the following structural formula (A-15) is particularly preferably used.

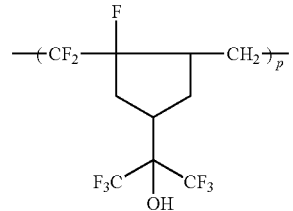

(A-15)

Subsequently, as a fifth aspect of the alkali-soluble polymer (a), a polymer having the constitutional unit represented by the general formula (A-16) can be used.

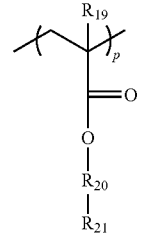

(A-16)

In the above general formula (A-16), $R_{19}$ is a hydrogen atom or methyl group, $R_{20}$ is an alkylene group having 1 to 5 carbon atoms, $R_{21}$ is a fluoroalkylene group having 1 to 5 carbon atoms where a portion of or all of the hydrogen atoms have been substituted with fluorine atoms, and p is the repeating unit number similarly to the general formulae (A-9) and (A-10).

As the constitutional unit represented by the above general formula (A-16), specifically those having the structure represented by the following structural formulae (A-17) and (A-18) are preferably used.

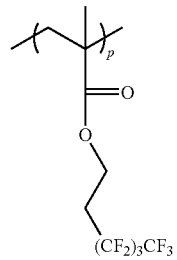

(A-17)

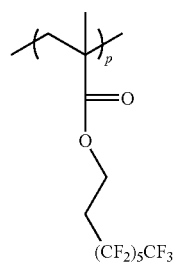

(A-18)

Subsequently, as a sixth aspect of the alkali-soluble polymer (a), a polymer having the constitutional unit represented by the general formula (A-19) can be used.

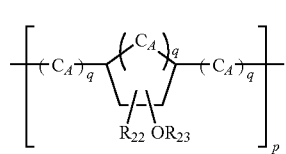

(A-19)

In the above general formula (A-19), CA is methylene group or fluoromethylene group, $R_{22}$ is a straight chain, branched chain or cyclic fluoroalkyl group having 1 to 5 carbon atoms where a portion of or all of the hydrogen atoms have been substituted with fluorine atoms, $R_{23}$ is a hydrogen atom, or a straight chain, branched chain or cyclic fluoroalkyl group having 1 to 5 carbon atoms where a portion of or all of the hydrogen atoms have been substituted with fluorine atoms, q is an integer of 0 to 3 and p is the repeating unit number similarly to the general formulae (A-9) and (A-10).

In the above general formula (A-19), a portion of or all of the hydrogen atoms bound to the carbon atoms which compose the ring skeleton may be substituted with fluorine atoms.

As the constitutional unit represented by the above general formula (A-19), specifically a structural unit represented by the following formula (A-20) is preferably used.

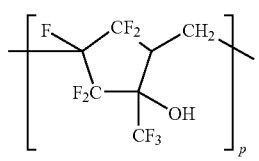

(A-20)

In the present invention, the aforementioned alkali-soluble polymer (a) may be the copolymer or the mixed polymer obtained by copolymerizing or mixing with the other optional monomer unit in the range in which the effects of the present invention are not impaired.

Such an alkali-soluble polymer (a) can be synthesized by publicly known methods. A mass average molecular weight (Mw) in terms of polystyrene of this polymer by GPC is not particularly limited, and is 2,000 to 80,000 and more preferably 3,000 to 50,000.

An amount of the alkali-soluble polymer (a) to be blended is preferably about 0.1 to 20% by mass and more preferably 0.3 to 10% by mass based on a total amount of the composition for the formation of the resist protection film.

(b) Ether-Based Solvent

The ether-based solvents (b) generally have a smaller SP value (solubility parameter) than alcohol-based solvents. Thus, compatibility with the polymer in the resist having a polar group becomes smaller compared with the case of using the alcohol-based solvents. As a result, damage to the resist film can be prevented, and it becomes possible to form the resist pattern having a good shape.

This ether-based solvent is a non-fluorine-based organic solvent. Thus, it becomes possible to provide the composition for the formation of the resist protection film having a reduced influence on the environment.

The ether-based solvent preferably has 2 to 10 carbon atoms and more preferably 3 to 8 carbon atoms. When the number of carbon atoms is within the above range, it becomes possible to further reduce the damage to the resist film, and an application property and a drying property of the composition for the formation of the resist protection film can be maintained.

Such an ether-based solvent specifically includes straight chain and branched chain alkyl ethers such as dimethyl ether, diethyl ether, methylethyl ether, dipropyl ether, diisopropyl ether and dibutyl ether. Among them, it is preferable to use at least one selected from diisopropyl ether and dibutyl ether. These can be used alone or in combination of two or more.

The boiling point of the ether-based solvent is preferably 200° C. or below in terms of application property and drying property of the composition for the formation of the resist protection film.

As the organic solvent in the composition for forming the resist protection film, it is preferable to use the ether-based solvent (b) alone, but it is also possible to use as a mixed solvent with the other organic solvent if necessary. When used as the mixed solvent, the amount of the ether-based solvent is preferably 80% or more by mass based on the total amount of the organic solvent. When the content of the ether-based solvent is within the above range, it becomes possible to provide the composition for forming the resist protection film in which the alkali-soluble polymer is well dissolved and damage to the resist film is further reduced.

(c) Crosslinking Agent

The composition for forming the resist protection film according to the present invention may further contain a crosslinking agent (c) if necessary. As this crosslinking agent, at least one nitrogen-containing compound selected from nitrogen-containing compounds having an amino group where a hydrogen atom has been substituted with at least one substituent selected from hydroxyalkyl groups and alkoxyalkyl groups, and nitrogen-containing compounds having an imino group where a hydrogen atom has been substituted with at least one substituent selected from hydroxyalkyl groups and alkoxyalkyl groups can be used.

These nitrogen-containing compounds include, for example, melamine-based derivatives, urea-based derivatives, guanamine-based derivatives, acetoguanamine-based derivatives, benzoguanamine-based derivatives and succinyl amide-based derivatives, where the hydrogen atom in the amino group has been substituted with methylol group or alkoxymethyl group or both thereof, and glycoluryl-based derivatives and ethylene urea-based derivatives, where the hydrogen atom in the imino group has been substituted.

These nitrogen-containing compounds are obtained, for example, by reacting the aforementioned nitrogen-containing compound with formalin in boiling water to methylolate, or further reacting this with lower alcohol, specifically methanol, ethanol, n-propanol, isopropanol, n-butanol or isobutanol to alkoxylate. Among them, the suitable crosslinking agent is tetrabutoxymethylated glycoluryl.

Furthermore as the crosslinking agent, a condensed product of a hydrocarbon compound substituted with at least one substituent selected from the hydroxyl group and the alkyloxy group, and monohydroxy-monocarboxylic acid compound can be suitably used. As the above monohydroxy-monocarboxylic acid, those where the hydroxyl group and a carboxyl group are bound to the same carbon atom or two adjacent carbon atoms are preferable.

When such a crosslinking agent is blended, its amount to be blended is preferably about 0.5 to 10% by mass based on the amount of the alkali-soluble polymer (a) to be blended.

(d) Acidic Compound

The material for forming the resist protection film according to the present invention may further be blended with an acidic compound (d) if necessary. By adding this acidic compound, the shape of the resist pattern is improved, and furthermore, even when the resist film is put in an atmosphere containing amine in a trace amount after the liquid immersion exposure and before the development (leave after the exposure step), an adverse effect of amine can be effectively prevented by interposing the protection film. Thereby, it can be forestalled that a large aberration occurs in the size of the resist pattern obtained by the subsequent development.

Such an acidic compound includes, for example, at least one selected from the following general formulae (D-1), (D-2), (D-3) and (D-4).

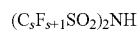   (D-1)

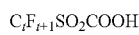   (D-2)

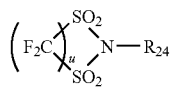   (D-3)

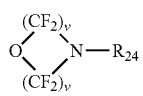   (D-4)

In the above general formulae (D-1) to (D-4), s is an integer of 1 to 5, t is an integer of 10 to 15, u is an integer of 2 to 3, v is an integer of 2 to 3, $R_{23}$ and $R_{24}$ are alkyl groups or fluoroalkyl groups having 1 to 15 carbon atoms (where a portion of the hydrogen atoms or the fluorine atoms may be substituted with hydroxyl, alkoxy, carboxy or amino groups).

Any of such acidic compounds are not subjected to Significant New Use Rule (SNUR), and are described to have no adverse effect on human bodies.

The acidic compound represented by the above general formula (D-1) is specifically preferably a compound such as $(C_4F_9SO_2)_2NH$, $(C_3F_7SO_2)_2NH$, and specifically a compound of $C_{10}F_{21}COOH$ is preferable as the acidic compound represented by the above general formula (D-2).

As the acidic compound represented by the above general formulae (D-3) and (D-4), specifically, the compounds represented by the following general formulae (D-5) and (D-6), respectively are preferable.

   (D-5)

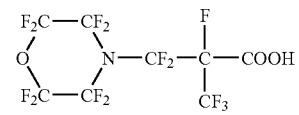   (D-6)

When the acidic compound is blended, its amount to be blended is preferably about 0.1 to 10% by mass in the composition for forming the resist protection film.

(e) Acid Generation Aid which Generates Acid in the Presence of Acid

The composition for forming the resist protection film according to the present invention may further be blended with an acid generation aid (e) if necessary. This acid generation aid refers to compounds which generate acid in the presence of acid and which do not generate acid in the absence of acid. Even if the acid generated by the acid generator in the resist film is diffused in the resist protection film, the acid generation aid in the resist protection film generate acid in the presence of the acid generated by the acid generator, and this acid generated by the acid generation aid compensates a shortage of the acid in the resist film. Thus, it becomes possible to prevent the deterioration of the resolution and the reduction of the focal depth width in the resist composition, thereby enabling the formation of a finer resist pattern.

It is preferable that such an acid generation aid is an alicyclic hydrocarbon compound having a carbonyl group and a sulfonyl group in its molecule.

It is preferable that such an acid generation aid is at least one selected from the compounds represented by the following general formulae (E-1) and (E-2).

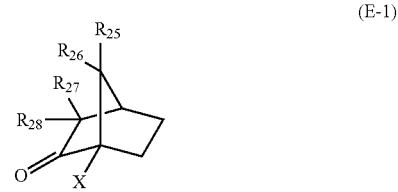   (E-1)

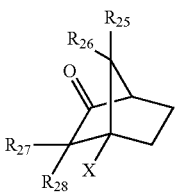   (E-2)

In the above general formulae (E-1) and (E-2), $R_{25}$ to $R_{28}$ are each independently hydrogen atoms, or straight chain or branched chain alkyl groups having 1 to 10 carbon atoms, and X is an electrophilic group having a sulfonyl group.

Here, the "straight chain or branched chain alkyl groups having 1 to 10 carbon atoms" include straight chain or branched chain saturated hydrocarbon groups such as methyl, ethyl, propyl, isopropyl, n-butyl, isobutyl, sec-butyl, tert-butyl, amyl, isoamyl, tert-amyl, hexyl, heptyl, octyl, isooctyl, 2-ethylhexyl, tert-octyl, nonyl, isononyl, decyl and isodecyl groups.

X is the "electrophilic group having the sulfonyl group". Here it is preferable that the "electrophilic group having the sulfonyl group" is —O—SO$_2$—Y. Here, Y is an alkyl group having 1 to 5 carbon atoms or a halogenated alkyl group having 1 to 10 carbon atoms. Among them, Y is preferably a fluoroalkyl group.

The compounds represented by the above general formulae (E-1) and (E-2) specifically include the compounds represented by the following formulae (E-3) to (E-10).

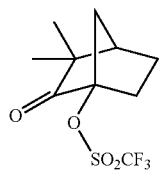
(E-3)

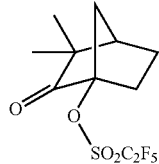
(E-4)

(E-5)

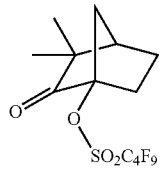
(E-6)

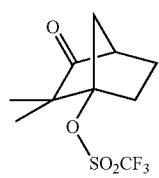
(E-7)

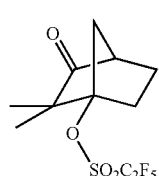
(E-8)

-continued

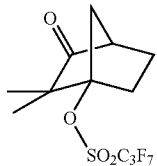
(E-9)

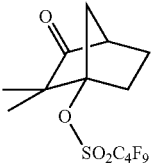
(E-10)

The amount of the acid generation aid (e) to be blended is preferably 0.1 to 50 parts by mass and more preferably 1 to 20 parts by mass based on 100 parts by mass of the alkali-soluble polymer (a). When the amount is within such a range, it becomes possible to effectively generate acid in the presence of acid eluted from the resist film to improve the resist pattern shape without producing uneven application.

(f) Others

The composition for forming the resist protection film according to the present invention may further be blended with any surfactant (f) as desired. This surfactant includes, but is not limited to, "XR-104" (brand name supplied from Dainippon Ink and Chemicals, Incorporated). By blending such a surfactant, it is possible to further enhance a film coating property and prevent elution.

When such a surfactant is blended, its amount to be blended is preferably 0.001 to 10 parts by mass based on 100 parts by mass of the alkali-soluble polymer (a).

The resist composition is not particularly limited, and any resist composition capable of being developed in an alkali aqueous solution and including negative and positive type resists can be used. Such a resist composition includes, but is not limited to, (i) positive type resist compositions containing a naphthoquinone diazide compound and a novolak resin, (ii) positive type resist compositions containing a compound which generates acid by exposure to light, a compound which decomposes by the acid to increase the solubility in the alkali aqueous solution and an alkali-soluble resin, (iii) positive type resist compositions containing a compound which generates acid by exposure to light and an alkali-soluble resin having a group which decomposes by the acid to increase the solubility in the alkali aqueous solution, and (iv) negative type resist compositions containing a compound which generates acid by exposure to light, a crosslinking agent and an alkali-soluble resin.

Method for Forming Resist Patterns

Subsequently, the method for forming the pattern by forming the resist protection film using the composition for forming the resist protection film and exposing the resist film through this resist protection film will be described.

The method for forming the resist pattern according to the present invention including the steps of: forming the resist film on a substrate, forming the resist protection film on the resist film using the composition for forming the resist protection film, exposing the resist film through the resist protection film, and removing the resist protection film with a developer and developing the resist film after the exposure step. This method for forming the resist pattern may employ the dry exposure process or may employ the liquid immersion lithography process.

Case of Dry Exposure Process

The "resist film formation step" refers to the step of forming the resist film on the substrate. Specifically, a publicly known resist composition is applied on a substrate such as silicon wafer using a publicly known method such as a spinner, and subsequently a prebaking treatment (PAB treatment) is performed to form the resist film. The resist film may be formed after providing one layer of an organic or inorganic anti-reflection film (underlayer anti-reflection film) on the substrate.

The resist composition is not particularly limited, and any resist composition capable of being developed in the alkali aqueous solution and including negative and positive type resists can be used. As such a resist composition, it is possible to use the resist composition as mentioned above.

The "protection film formation step" refers to the step of forming the resist protection film. Specifically, it refers to the step of forming the resist protection film by uniformly applying the composition for forming the protection film according to the present invention on the surface of the resist film formed in the resist film formation step by the same method as in the resist film formation step and baking to cure.

The "exposure step" refers to the step of performing the exposure at a predetermined wavelength through a mask pattern from above the resist protection film formed in the protection film formation step. At that time, an exposed light passes through the resist protection film to attain the resist film.

The wavelength used for the exposure in this case is not particularly limited, and is appropriately selected depending on the property of the resist film. For example, ionizing radiation such as ArF excimer laser, KrF excimer laser, $F_2$ excimer laser, extreme ultraviolet light (EUV), vacuum ultraviolet light (VUV), electron beam, X ray and soft X ray can be used. In the case of the present embodiment, the exposure wavelength is particularly preferably 193 nm.

It is preferable that the refractive index of the resist protection film at the exposure wavelength is higher than that of water at the same wavelength.

It is also preferable that the post-exposure baking (PEB) is given to the resist film and the resist protection film after the exposure step.

The "development step" refers to the step of performing a development treatment of the resist film after the exposure step using an alkali developer composed of the alkali aqueous solution. Since this developer is alkaline, when the resist protection film is formed on the surface of the resist film, first the resist protection film is dissolved and then a soluble portion of the resist film is dissolved. The postbaking treatment may be performed after the development.

Case of Liquid Immersion Lithography Process

In the liquid immersion lithography process, the same procedures as in the case of the dry exposure process are used until the "protection film formation step". And, in the "exposure step", the liquid immersion medium is disposed on the substrate on which the resist protection film has been formed, and in this state, the exposure is performed selectively through the mask pattern to the resist film and the resist protection film on the substrate. Therefore, the exposed light at that time passes through the liquid immersion medium and the resist protection film to attain the resist film.

At that time, the resist film is blocked from the liquid immersion medium by the resist protection film. Thus preventing invasion of the liquid immersion medium into the resist film causing alterations such as swelling, or conversely, preventing elution of the component into the liquid immersion medium altering the optical property such as the refractive index of the liquid immersion medium itself.

The exposed light is not particularly limited as is the case with the dry exposure process, and radiation such as ArF excimer laser, KrF excimer laser and VUV (vacuum ultraviolet light) can be used.

Here, the liquid immersion medium is not particularly limited as long as it is a liquid having a refractive index which is larger than that of the air and is smaller than that of the resist film used. Such a liquid immersion medium includes water (pure water, deionized water) and fluorine-based inert liquids, and it is possible to use the liquid immersion medium having a high refractive index property, which is anticipated to be developed in the near future. Specific examples of the fluorine-based inert liquid include the liquid composed mainly of a fluorine-based compound such as $C_3HCl_2F_5$, $C_4F_9OCH_3$, $C_4F_9OC_2H_5$, $C_5H_3F_7$ and the like. Among such liquids for the liquid immersion exposure, in terms of cost, safety, environmental problems and versatility, it is preferable to use the water (pure water, deionized water), but when the exposed light at the wavelength of 157 nm (e.g., $F_2$ excimer laser), in terms of reduced absorption of the exposed light, it is preferable to use the fluorine-based solvent.

When the exposure step in the liquid immersion state is completed, the substrate is taken out from the liquid immersion medium and the liquid is removed from the substrate. It is preferable to give PEB to the resist film as the protection film is laminated on the resist film after the exposure.

Then, the resist film and the resist protection film after the exposure step are heated and developed using the alkali developer in the same way as in the case of the dry exposure process. As the alkali developer, it is possible to appropriately select and use a publicly known developer. The resist protection film and the soluble portion of the resist film are dissolved and removed simultaneously by this alkali development treatment. The development treatment may be followed by postbaking.

Subsequently, the resist film is rinsed by using pure water or the like. In this rinsing with water, the developer, and resist protection film components and the resist composition dissolved by this developer on the substrate are washed out, for example, by dropping or spraying the water on the substrate surface while rotating the substrate. Then, a resist pattern, in which a resist film is patterned in a shape corresponding to a mask pattern, is obtained by drying.

In the present invention, thus the removal of the resist protection film and the development of the resist film are realized simultaneously in the development step. In the resist protection film formed from the composition for forming the resist protection film of the present invention, the water repellent property is enhanced. Thus, the liquid immersion medium is easily separated after the exposure step, the amount of the adhered liquid immersion medium is small and so-called liquid immersion medium leakage is reduced.

By forming resist patterns in this way, resist patterns having fine line widths, particularly line-and-space patterns having a small pitch can be produced with good resolution. The pitch in the line-and-space pattern refers to a total distance of a resist pattern width and a space width in a line width direction of the pattern.

A resist pattern formed by such a method takes a better rectangular shape compared with the case of forming a resist pattern using a composition for the formation of the resist protection film using a conventional alcohol-based solvent.

EXAMPLES

Examples 1 to 3

First, a composition 1 for forming a resist protection film composed of a solution of 1.5% by mass of an alkali-soluble polymer represented by the following structural formula (X-1) (mass average molecular weight: 5,000) in dibutyl ether was prepared. Also, a composition 2 for forming a resist protection film composed of a solution of 1.5% by mass of an alkali-soluble polymer represented by the following structural formula (X-2) (mass average molecular weight: 4,000) in dibutyl ether was prepared. Further, a composition 3 for forming a resist protection film composed of a solution of 1.5% by mass of an alkali-soluble polymer represented by the following structural formula (X-1) in diisopropyl ether was prepared.

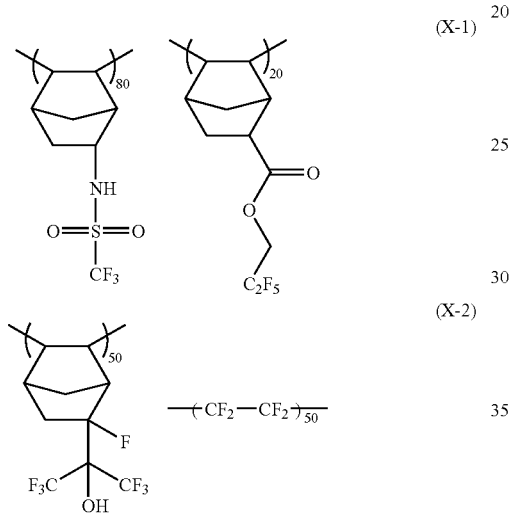

Comparative Example 1

A composition 4 for forming a resist protection film was prepared in the same way as in Example 1, except that the solvent in Example 1 was changed to isobutanol.

Then, TArF-7a128 (supplied by Tokyo Ohka Kogyo Co., Ltd.) which was a resist material containing an acrylic resin was applied on a substrate on which ARC29 (supplied by Brewer Co., Ltd.) having a film thickness of 77 nm had been formed, and heated at 110° C. for 60 seconds to form a resist film having a film thickness of 170 nm. Further, each of the compositions 1 to 4 for forming the resist protection film were respectively applied to thus formed resist films and heated at 90° C. for 60 seconds to each form a resist protection film having a film thickness of 35 nm.

These substrates underwent exposure using an exposing device NSR-S302A (supplied by Nikon Corporation), and after exposure, pure water was dropped for one minute to place the substrates under a pseudo-liquid immersion environment. Then, post-exposure baking at 100° C. for 60 seconds was performed, and subsequently a development treatment for 30 seconds using NMD-3 (supplied by Tokyo Ohka Kogyo Co., Ltd.) and a rinsing treatment were given to form each pattern.

As a result of observing the thus formed resist patterns using SEM (scanning electron microscope), the resist patterns in the cases of using the compositions 1 to 3 for forming the resist protection film in Examples 1 to 3 had good rectangular shapes. On the contrary, in the shape of the resist pattern in the case of using the composition 4 for forming the resist protection film in Comparative Example 1, a pattern top part was a T-top shape.

The invention claimed is:

1. A composition for forming a resist protection film on a resist film,
comprising: a. an alkali-soluble polymer; and b. an ether-based solvent, wherein
said alkali-soluble polymer a. has at least one monomer unit represented by the following general formula A-1, and at least one monomer unit selected from the group consisting of the monomer units represented by the following general formulae A-3 and A-4 as a constitutional unit:

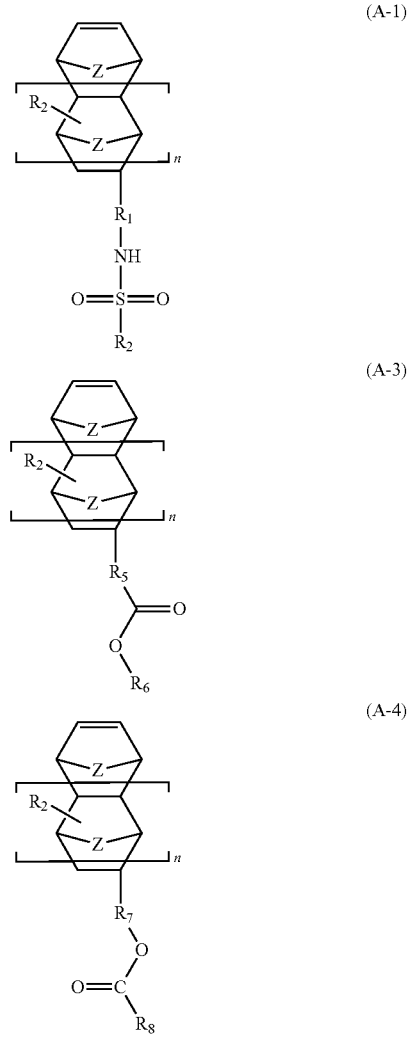

in the above formulae, $R_1$ is an alkylene group or a fluoroalkylene group having 1 to 6 carbon atoms, $R_2$ are each independently hydrogen atoms or straight chain, branched chain or cyclic alkyl groups or fluoroalkyl groups having 1 to 6 carbon atoms, $R_5$ and $R_7$ are each independently an alkylene group or a fluoroalkylene group having 1 to 6 carbon atoms, $R_6$ and $R_8$ are each independently a straight chain, branched chain or cyclic fluoroalkyl group having 1 to 15 carbon atoms; wherein, a part of hydrogen atoms or fluorine atoms of the fluoroalkyl group may be substituted with a hydroxyl group, Z is an alkylene group having 1 to 2 carbon atoms or an oxygen atom, and n is an integer of 0 to 3, and
wherein said ether-based solvent b. is at least one selected from diisopropyl ether and dibutyl ether.

2. A method for forming a resist pattern, comprising the steps of:
    forming a resist film on a substrate;
    forming a resist protection film on said resist film using the composition for forming the resist protection film according to claim 1;
    exposing said resist film through said resist protection film; and
    removing said resist protection film with a developer and developing said resist film after the exposure step.

3. The method for forming the resist pattern according to claim 2, wherein said exposure step is a step of disposing a liquid immersion medium on said resist protection film and exposing selectively said resist film through the liquid immersion medium.

* * * * *